United States Patent
Sohda et al.

(10) Patent No.: US 7,683,313 B2
(45) Date of Patent: Mar. 23, 2010

(54) CHARGED PARTICLE BEAM MEASUREMENT EQUIPMENT, SIZE CORRECTION AND STANDARD SAMPLE FOR CORRECTION

(75) Inventors: Yasunari Sohda, Kawasaki (JP); Yoshinori Nakayama, Sayama (JP); Hajime Koyanagi, Koshigaya (JP); Keiichiro Hitomi, Kokubunji (JP)

(73) Assignee: Hitachi High-Technologies Corporation, Tokyo (JP)

( * ) Notice: Subject to any disclaimer, the term of this patent is extended or adjusted under 35 U.S.C. 154(b) by 86 days.

(21) Appl. No.: 12/010,852

(22) Filed: Jan. 30, 2008

(65) Prior Publication Data
US 2008/0203285 A1    Aug. 28, 2008

(30) Foreign Application Priority Data
Feb. 28, 2007    (JP)    ............... 2007-049357

(51) Int. Cl.
G01D 18/00    (2006.01)
(52) U.S. Cl. ............................................. 250/252.1
(58) Field of Classification Search ............... 250/252.1
See application file for complete search history.

(56) References Cited

U.S. PATENT DOCUMENTS

| | | | | |
|---|---|---|---|---|
| 4,567,364 | A * | 1/1986 | Kano et al. ............... | 250/307 |
| 4,885,472 | A * | 12/1989 | Young ..................... | 250/491.1 |
| 5,336,895 | A * | 8/1994 | Nakano ................... | 250/505.1 |
| 5,451,487 | A * | 9/1995 | Abe et al. ................. | 430/296 |
| 5,528,047 | A * | 6/1996 | Nakajima ................. | 250/491.1 |
| 5,804,460 | A * | 9/1998 | Bindell et al. ............. | 438/16 |
| 6,358,860 | B1 * | 3/2002 | Scheer et al. ............. | 438/745 |
| 6,414,305 | B1 * | 7/2002 | Bendall ................... | 250/252.1 |
| 6,420,700 | B2 * | 7/2002 | Ooaeh et al. ............. | 250/252.1 |
| 6,426,501 | B1 * | 7/2002 | Nakagawa ............... | 250/310 |
| 6,570,157 | B1 * | 5/2003 | Singh et al. .............. | 250/311 |
| 6,573,497 | B1 * | 6/2003 | Rangarajan et al. ....... | 250/306 |
| 6,653,634 | B1 * | 11/2003 | Otaka et al. .............. | 250/311 |
| 6,960,767 | B1 * | 11/2005 | Do et al. .................. | 250/311 |
| 6,978,215 | B2 | 12/2005 | Nikitin | |

(Continued)

FOREIGN PATENT DOCUMENTS

JP    2005-241328    2/2004

(Continued)

*Primary Examiner*—David P Porta
*Assistant Examiner*—Kiho Kim
(74) *Attorney, Agent, or Firm*—Stities & Harbison PLLC; Juan Carlos A. Marquez, Esq.

(57) ABSTRACT

Correction of widths obtained by measurement of a sample with the use of a scanning electron microscope is executed with greater precision. A standard sample for correction comprises a plurality of correction mark members, the respective correction mark members, being lined up at specified intervals in a specified direction, and respective widths thereof, in the specified direction, differing from each other so as to be of respective sizes as pre-set. Measurement of the respective widths of the correction mark members is made to obtain respective measurement widths while authorized widths of the correction mark members are kept stored in an image processing unit of the scanning electron microscope to thereby find differences between the respective measurement widths, and authorized widths corresponding thereto, and the differences are stored as respective correction functions to correct the measurement width of the sample.

5 Claims, 10 Drawing Sheets

U.S. PATENT DOCUMENTS

| | | | |
|---|---|---|---|
| 7,067,819 B2 * | 6/2006 | Janik | 250/372 |
| 7,078,691 B2 * | 7/2006 | Nakayama | 250/311 |
| 7,365,306 B2 * | 4/2008 | Nakayama | 250/252.1 |
| 7,372,016 B1 * | 5/2008 | Tortonese et al. | 250/252.1 |
| 7,442,947 B2 * | 10/2008 | Yamada | 250/492.22 |
| 2002/0082789 A1 | 6/2002 | Takizawa et al. | |
| 2003/0115569 A1 * | 6/2003 | Ikeuchi | 716/19 |
| 2008/0067370 A1 * | 3/2008 | McCaffrey | 250/306 |

FOREIGN PATENT DOCUMENTS

JP  2006-017567  7/2004

* cited by examiner

CHARGED PARTICLE BEAM MEASUREMENT EQUIPMENT, SIZE CORRECTION AND STANDARD SAMPLE FOR CORRECTION

CLAIM OF PRIORITY

The present application claims priority from Japanese application JP 2007-049357 filed on Feb. 28, 2007, the content of which is hereby incorporated by reference into this application.

FIELD OF THE INVENTION

The invention relates to a charged particle beam measurement equipment wherein a sample is irradiated with a charged particle beam to be thereby scanned, and a size data item on an area of the sample is obtained on the basis of data obtained from a secondary particle from the sample, a size correction method using the same, and a standard sample for correction, to be used in the equipment and in carrying out the method.

BACKGROUND OF THE INVENTION

With a charged particle beam measurement equipment, results of measurements on a sample are corrected by use of a standard sample for correction. Technologies for use in such correction include, for example, one that is disclosed in JP-A No. 2005-241328 described hereunder.

In the case of the JP-A No. 2005-241328, use has been made of a standard sample for correction, wherein a plurality of grooves, each having a specified width, are formed at predetermined pitches on a silicone substrate by etching and so forth. In the case of the technology disclosed in the JP-A No. 2005-241328, respective intervals between a predetermined number of the grooves of the standard sample for correction are measured to find an error between results of measurement, and actual respective intervals between the predetermined number of the grooves of the standard sample for the correction, and on the assumption that an error undergoes linear variation in relation to size variation when the sample is actually measured, a size obtained by measurement is corrected.

SUMMARY OF THE INVENTION

With a measurement technology using a charged particle beam, it is desired that measurement can be always made with greater accuracy.

Accordingly, the invention has been developed in order to meet such desire, and it is an object of the invention to provide a charged particle beam measurement equipment capable of executing correction of size data obtained by measurement with greater precision, a size correction method using the same, and a standard sample for correction, for use in the equipment, and in carrying out the method.

To that end, the invention provides in its one aspect a standard sample member for correction to be used in correction of a size data item obtained from a secondary particle generated by irradiation with a charged particle beam, said standard sample member for the correction comprising a plurality of correction mark members lined up in a specified direction with a specified interval kept between the respective correction mark members adjacent to each other, wherein respective widths of the plurality of the correction mark members, in the specified direction, differ from each other, and are of respective sizes as preset.

Further, in the case where the standard sample member for correction is used for correction of the size data item, respective widths of the plurality of correction mark members are preferably twice as large as a diameter of the charged particle beam falling thereon. In the case where the standard sample member for correction is used for measurement of the diameter of the charged particle beam falling thereon, the respective widths of the plurality of correction mark members are preferably less than twice the diameter of the charged particle beam falling thereon.

Further, respective surface areas of the plurality of correction mark members, spreading in the direction in which the plurality of correction mark members are lined up, on the surface of the standard sample member for correction, are preferably not less than an area of a data acquisition region for two-dimensional distribution data that can be obtained from the secondary particle generated by irradiation with the charged particle beam.

Further, the invention provides in its another aspect a charged particle beam measurement equipment for obtaining a size data item on an area of a sample on the basis of data obtained from a secondary particle from the sample by irradiating the sample with a charged particle beam to be scanned, said charged particle beam measurement equipment comprising first storage unit for storing width data items of respective correction mark members of a standard sample for correction, the standard sample for correction being provided with a plurality of the correction mark members having respective widths differing from each other, error computation unit for finding a difference between a measurement width data item on each of the correction mark members of the standard sample for the correction, obtained by irradiating and scanning the sample with the charged particle beam, and a width data item corresponding thereto among a plurality of the width data items stored in the first storage unit on a measurement width data item-by-measurement width data item basis, relationship generation unit for finding a relationship between the respective measurement width data items on the correction mark members of the standard sample for the correction, obtained by irradiating and scanning the sample with the charged particle beam, and respective errors corresponding thereto, found by the error computation unit, or a relationship between the respective measurement width data items, and respective post-correction width data items after correction with the respective errors found by the error computation unit, second storage unit for storing the relationship found by the relationship generation unit, and correction unit for correcting the measurement width data items obtained by irradiating and scanning the sample with the charged particle beam by use of the relationship found by the relationship generation unit.

Still further, the invention provides in its still another aspect a size correction method using a charged particle beam measurement equipment for obtaining a size data item on an area of a sample on the basis of data obtained from a secondary particle from the sample by irradiating the sample with a charged particle beam to be scanned, said size correction method pre-storing width data items of respective correction mark members of a standard sample for correction in the charged particle beam measurement equipment, the standard sample for correction being provided with a plurality of the correction mark members having respective widths differing from each other, and causing the charged particle beam measurement equipment to execute an error computation step of finding a difference between a measurement width data item on each of the correction mark members of the standard sample for the correction, obtained by irradiating and scanning the sample with the charged particle beam, and a width data item corresponding thereto among a plurality of width data items stored on a measurement width data item-by-measurement width data item basis, a relationship generation step of finding a relationship between the respective measurement width data items on the correction mark members of the standard sample for the correction, obtained by irradiating and scanning the sample with the charged particle beam, and respective errors corresponding thereto, found by the error computation unit, or a relationship between the respective measurement width data items, and respective post-correction width data items after correction with the respective errors found by the error computation unit, and a correction step of correcting the measurement width data items obtained by irradiating and scanning the sample with the charged particle beam by use of the relationship found by the relationship generation step.

Thus, with the present invention, when the correction mark members having respective widths differing from each other are measured, respective correction functions are determined on the basis of errors of the respective measurement widths, thereby correcting the respective measurement widths of the sample according to the respective correction functions, so that even if an error is nonlinear in relation to variation in measurement width, measurement width can be corrected with greater precision.

DETAILED DESCRIPTION OF THE PREFERRED EMBODIMENTS

Various embodiments of the invention are described hereinafter with reference to the accompanying drawings.

First, a first embodiment of a charged particle measurement equipment according to the invention is described with reference to FIGS. 1 to 6.

The charged particle measurement equipment according to the present embodiment is a scanning electron microscope wherein a sample is irradiated with an electron beam to be thereby scanned, and a width of an area of the sample is measured on the basis of a secondary electron (reflection electron) from the sample.

Figure 1:
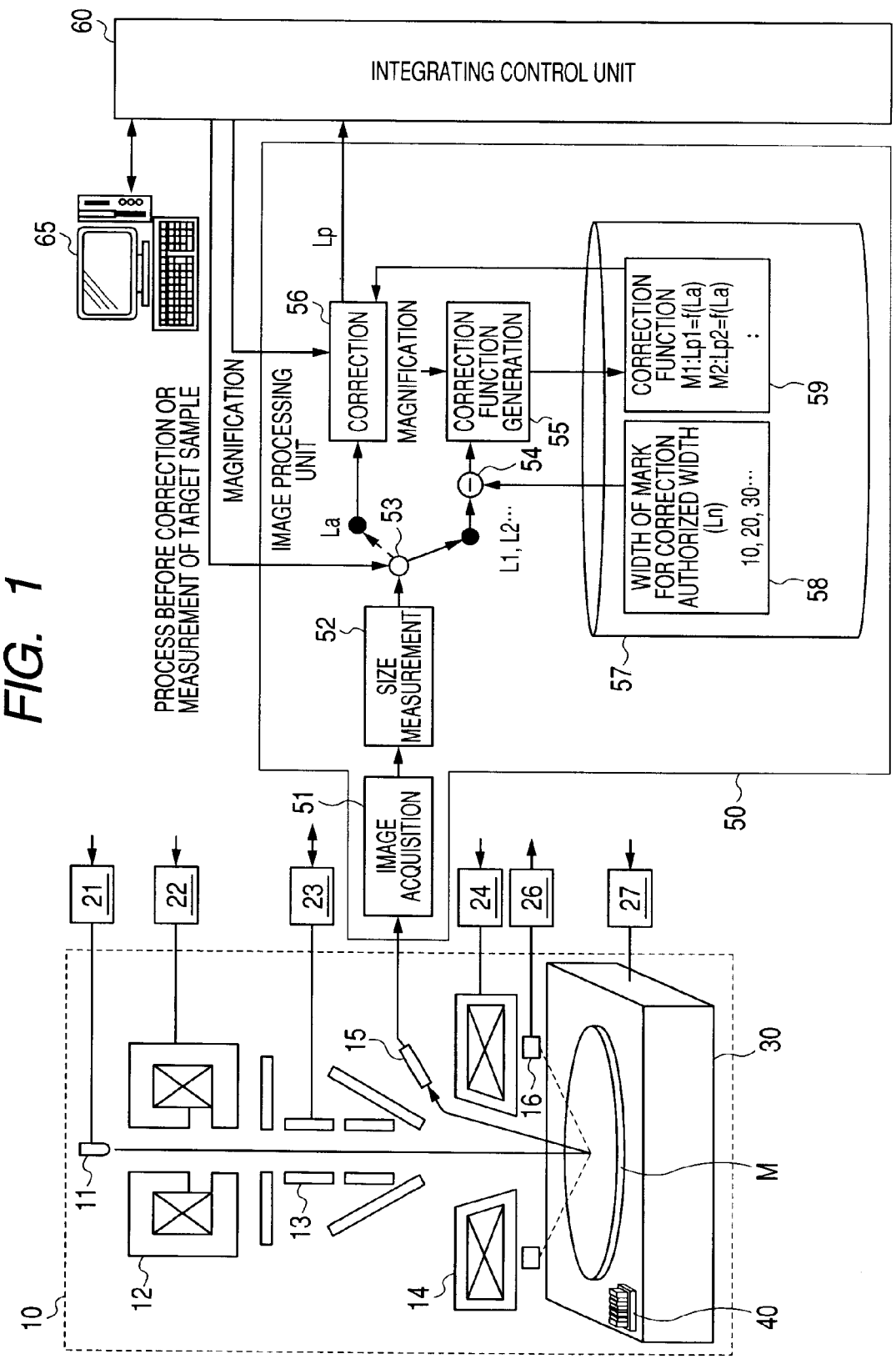
FIG. 1 is a schematic block diagram showing makeup of a first embodiment of a scanning electron microscope according to the invention.

As shown in FIG. 1, the scanning electron microscope comprises an electron optical system 10 for irradiating a sample M with an electron beam to scan the sample M to thereby detect a secondary electron released from the sample M, various power supply circuits, and so forth, 21 to 27, a stage 30 for placing the sample M thereon, a carrier unit (not shown) for carrying the sample M, and so forth from outside to be placed on the stage 30, an image processing unit 50 for executing image processing of data on the secondary electron as detected by the electron optical system 10, an integrating control unit 60 for controlling the various power supply circuits, and so forth, 21 to 27, the image processing unit 50, and the carrier unit, and an input/output unit 65 for displaying an output from the integrating control unit 60 while giving instructions to the integrating control unit 60.

The electron optical system 10 comprises an electron gun 11 for generating electron beams, condenser lenses 12 for condensing the electron beams, deflectors 13 for scanning the sample M with the electron beam, objective lenses 14 for causing the electron beams to focus on the sample M, a detector 15 for detecting the secondary electron form the sample M, and height sensors 16 for detecting a height of the sample M.

The various power supply circuits, and so forth, 21 to 27, comprises an electron gun power supply circuit 21 for driving and controlling the electron gun 11, a condenser lens power supply circuit 22 for driving and controlling the condenser lenses 12, a deflector power supply circuit 23 for driving and controlling the deflectors 13, a objective lens power supply circuit 24 for driving and controlling the objective lenses 14, a sensor controller 26 for driving and controlling the height sensors 16, and converting respective analog signals from the height sensors 16 into digital signals, respectively, and a stage controller 27 for driving and controlling the stage 30. Each of those power supply circuits, and so forth, 21 to 27, receives a control signal from the integrating control unit 60. The sensor controller 26 converts the respective analog signals from the height sensors 16 into the digital signals, as described above, to be transmitted to the integrating control unit 60 while receiving the control signal from the integrating control unit 60.

The image processing unit 50 comprises an image acquisition subunit 51 for acquiring a secondary electron image on the basis of the data on the secondary electron from the detector 15, a size measurement subunit 52 for measuring a width of a specified area on the basis of the secondary electron image, a subtracter 54 for finding a difference between a measurement width L of a standard sample 40 for correction, as described later in the present specification, and an authorized width Ln thereof, a correction function generation subunit 55 for finding a correction function to be used for correction of a measurement width La with reference to the sample M on the basis of results of subtraction by the subtracter 54, a correction subunit 56 for correcting the measurement width La with reference to the sample M by use of the correction function, a memory 57 for storing various data, and a switching subunit 53 for selectively switching a transmission destination of measurement data obtained by the size measurement subunit 52 to either the subtracter 54, or the correction subunit 56.

The memory 57 has an authorized width storage region 58 for storing the authorized widths Ln of the standard sample 40 for the correction, and a correction function storage region 59 for storing the correction function generated by the correction function generation subunit 55.

Further, the image processing unit 50, and the integrating control unit 60 each are a computer comprising a CPU for executing various operations, a memory, an external storage, an input interface, an output interface, and so forth. Accordingly, the respective function subunits 51 to 56 of the image processing unit 50 are operated by the CPU running a program stored in the external storage or the memory. The memory 57 of the image processing unit 50 comprises the external storage or the memory.

Further, the input/output unit 65 is also a computer comprising a display unit for displaying various data, and an input unit for accepting various instructions and so forth in addition to a CPU for executing various operations, a memory, an external storage, an input interface, an output interface, and so forth.

Figure 2:
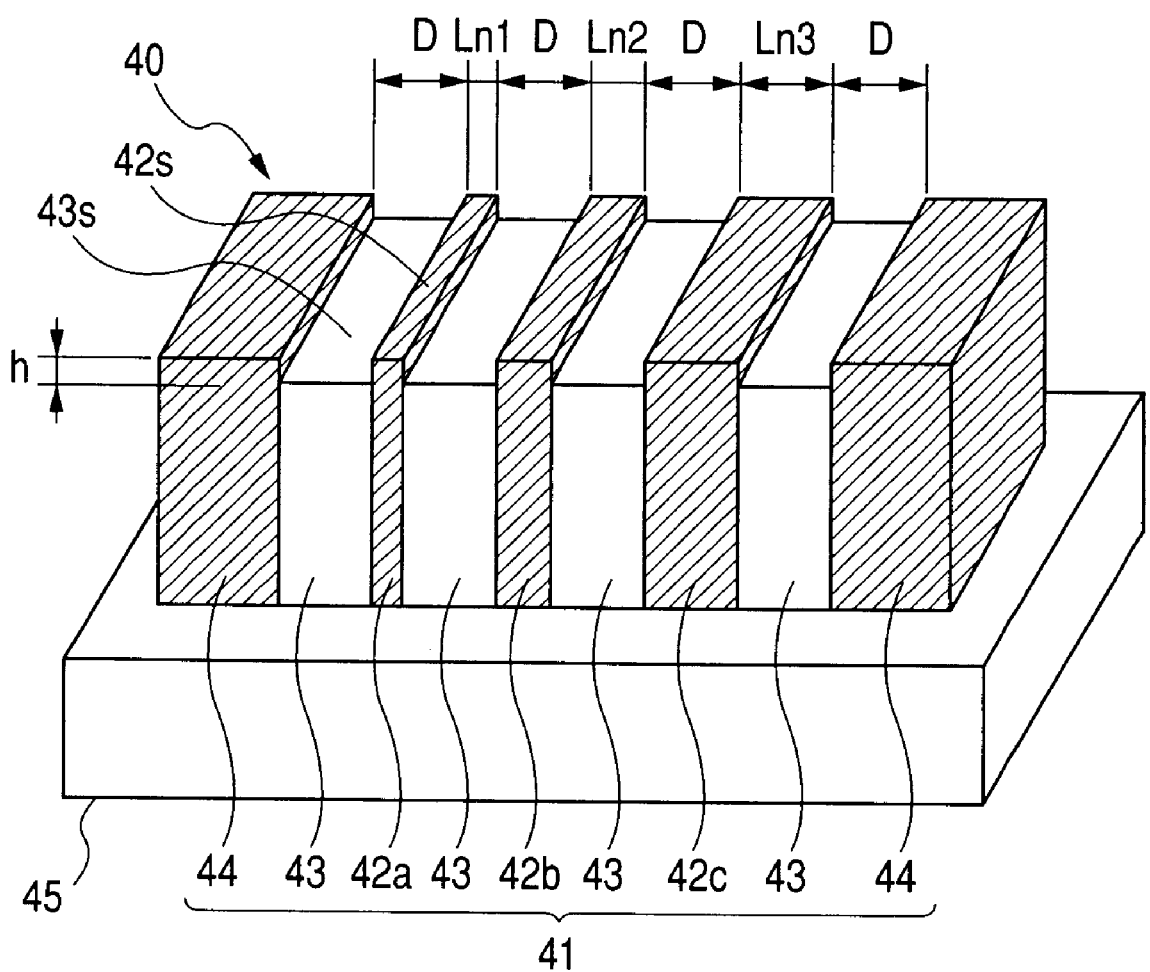
FIG. 2 is a schematic perspective view showing a standard sample for correction, according to the first embodiment of the invention.

As shown in FIG. 2, the standard sample 40 for the correction has a standard sample member 41 for correction, and a base 45 to which the standard sample member 41 for correction is fixedly attached. The standard sample member 41 for the correction comprises a plurality of correction mark members 42a, 42b, . . . , interval holding members 43, 43, . . . , for holding an interval between adjacent correction mark members of the correction mark members 42a, 42b, . . . , and end forming members 44, 44. The plurality of the correction mark members 42a, 42b, . . . are lined up at specified intervals kept therebetween in a specified direction, and respective widths thereof, Ln1, Ln2, . . . in the specified direction, differ from each other. With the present embodiment, the plurality of the correction mark members 42a, 42b, . . . have the respective widths thereof, Ln1, Ln2, . . . , in a range of from 10 nm increasing by a unit of 10 nm up to 200 nm. On the other hand, the width of each of plural interval holding members 43, 43 is 30 nm.

One surface 42s (hereinafter referred to as an irradiated face) of surfaces of each of the correction mark members 42a, 42b, . . . (hereinafter referred to merely as the correction mark members 42 unless necessary), parallel to a direction of a lineup thereof, is deviated from a surface 43s (hereinafter referred to as an irradiated face) of each of the interval holding members 43, parallel to the surface 42s, in a direction vertical to the direction of the lineup, so that the surface 43s of the interval holding member 43 is depressed against the surface 42s of the correction mark member 42. A ratio of a step difference from the surface 43s of the interval holding member 43 to the surface 42s of the correction mark member 42, that is, a height difference Δh to the width Ln of the correction mark member 42, namely, an aspect ratio is preferably not more than 2 from the viewpoint of preventing a protruded part of the correction mark member 42 from falling toward the interval holding member 43. Accordingly, with the present embodiment, the height difference Δh is set to 20 nm, thereby keeping the aspect ratio (∥h/Ln1=20/10=2) at 2 or less at the maximum.

With the present embodiment, the plurality of the correction mark members 42a, 42b, . . . , and the end forming members 44, 44 are formed of molybdenum, and the plurality of the interval holding members 43, 43, . . . are formed of silicone.

The standard sample member 41 for correction is fabricated by forming a multilayer film member made up of molybdenum films, and silicone films, and by etching the respective silicone films in a direction vertical to a direction in which respective layers of the multilayer film member are lined up, thereby causing a difference in step to occur between an end face of each of the molybdenum films, and an end face of each of the silicone films.

The standard sample member 41 for correction is fixedly attached to the base 45.

The respective widths Ln1, Ln2, . . . of the plurality of the correction mark members 42a, 42b, . . . of the standard sample 40 for the correction are accurately measured on the basis of grating images of a transmission electron microscope, and values of the respective widths as the respective authorized widths are stored in the authorized width storage region 58 of the memory 57. The respective widths Ln1, Ln2, . . . of the plurality of the correction mark members 42a, 42b, . . . can also be accurately measured with optical interference, and an AFM (Atomic force Microscope).

Now, with the present embodiment, the respective members 42, 43 are formed of molybdenum, and silicone, respectively, for the following reason.
1) There is a large difference in atomic number between molybdenum and silicon of silicone, so that it is easier to obtain a contrast in reflection electron signal.
2) A multilayer film uniform in thickness can be formed by sputtering.
3) A steep interface can be obtained.
4) There exists an etchant with which a high selection ratio can be obtained A conventional standard sample for correction is fabricated by forming a plurality of grooves with a predetermined width at predetermined pitches on a silicone substrate by etching and so forth, as previously described. With this standard sample for correction, by taking advantage of a difference in height between protruded parts, and depressed parts, a contrast between respective reflection electron signals from the protruded parts, and the depressed parts is secured. However, if the protruded parts are formed to have a width so as to enable more accurate correction while securing the difference in height between the protruded parts, and the depressed parts, at not less than a given value, this will cause the protruded parts to be liable to easily fall, and there is a given limitation to the extent to which the protruded parts are decreased in width. In contrast, with the present embodiment, while a contrast between respective reflection electron signals from the protruded parts, and the depressed parts is obtained by taking advantage of a difference in height between the protruded parts, and the depressed parts, the contrast between respective reflection electron signals from the protruded parts, and the depressed parts is also obtained by causing a constituent material (molybdenum) of the protruded parts to differ from a constituent material (silicone) of the depressed parts, so that a sufficient contrast can be obtained even if the difference in height between the protruded parts, and the depressed parts is rendered smaller than that according to the conventional technology. For this reason, with the present embodiment, it is possible to avoid fall of the protruded parts even if widths of the protruded parts are decreased. That is, with the present embodiment, the protruded parts can be decreased in width as compared with the case of the conventional technology.

Further, with the present embodiment, of the molybdenum film, and the silicone film, the silicone film is etched, however, the molybdenum film may be etched instead. In this case, since silicone has higher rigidity, there is gained an advantage in that an aspect ratio can be rendered higher. In this case, however, a reflection electron signal itself from silicone of which the correction mark member is formed will decrease, and therefore, a method for etching the molybdenum film is suited for correction requiring a high aspect ratio as in the case of measuring a tilt angle of the beam.

Figure 3:
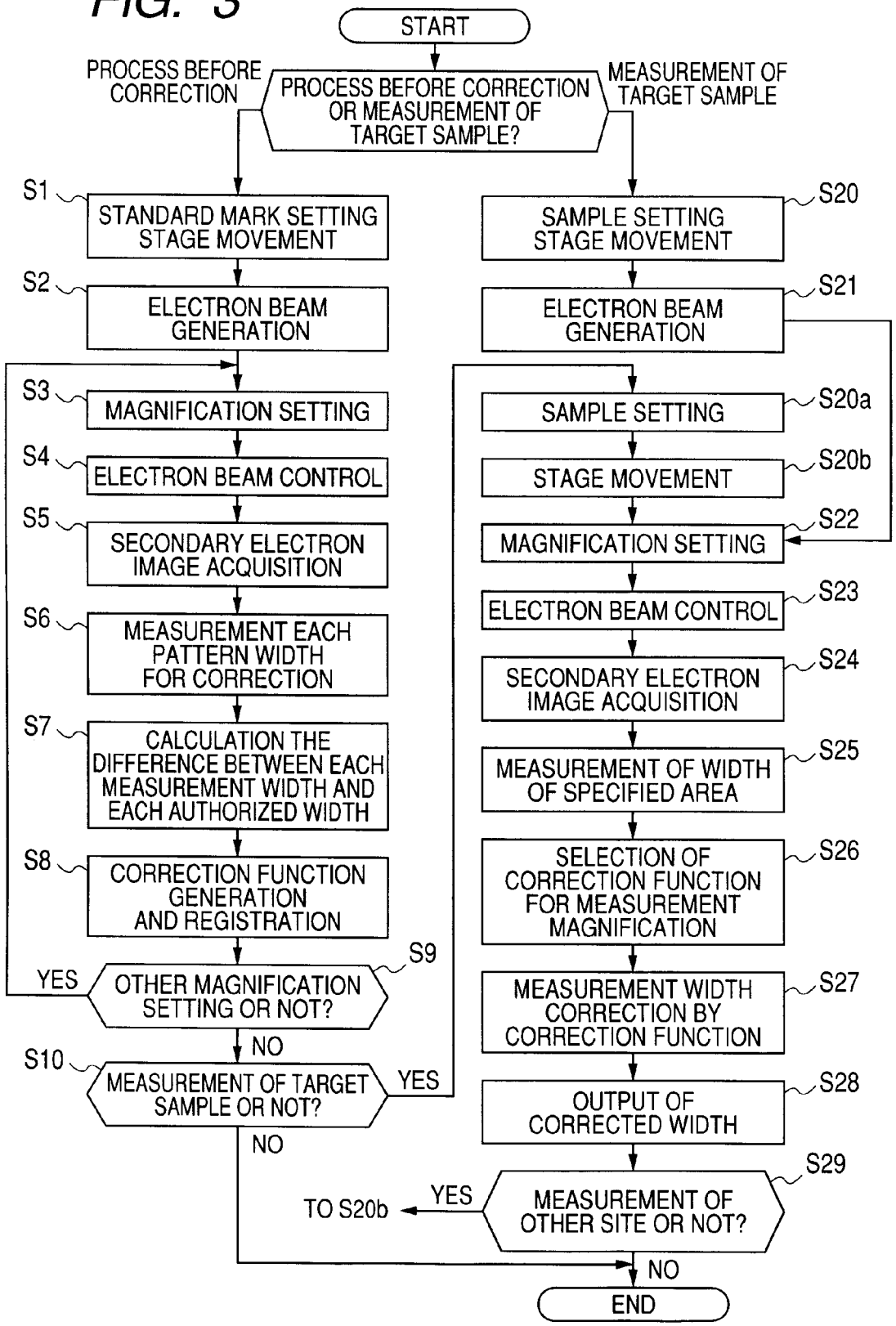
FIG. 3 is a flow chart showing operation of the scanning electron microscope according to the first embodiment of the invention.

Now, operation of the scanning electron microscope is described hereinafter with reference to a flow chart shown in FIG. 3.

First, the input/output unit 65 accepts an instruction on whether a process before correction is executed, or measurement of a sample M is executed (step S0). In the case of executing the process before the correction, the integrating control unit 60 issues an instruction to the carrier unit (not shown) to thereby set the standard sample 40 for the correction to a predetermined position on the stage 30, and subsequently, move the stage 30 so as to enable the standard sample 40 for the correction to be irradiated with an electron beam (step S1). Further, the integrating control unit 60 issues an instruction to the switching subunit 53 of the image processing unit 50 to thereby transmit size data obtained by the size measurement subunit 52 of the image processing unit 50 to the subtracter 54.

Subsequently, the integrating control unit 60 issues an instruction to the electron gun power supply circuit 21 to thereby cause the electron gun 11 to output an electron beam (step S2), and issues an instruction to the deflector power supply circuit 23 such that a magnification is set to a magnification as accepted by the input/output unit 65 to thereby set the magnification to the accepted magnification (step S3). At this point in time, it is preferable for an operator to input a magnification to be adopted for the measurement of the target sample, to be executed after the process before the correction. The integrating control unit 60, subsequently, issues an instruction to the condenser lens power supply circuit 22, the deflector power supply circuit 23, the objective lens power supply circuit 24, and so forth, to thereby cause electron beams to focus on a standard sample 40 for correction, causing the standard sample 40 for the correction to be irradiated with the electron beams to be then scanned (step S4).

Figure 4:
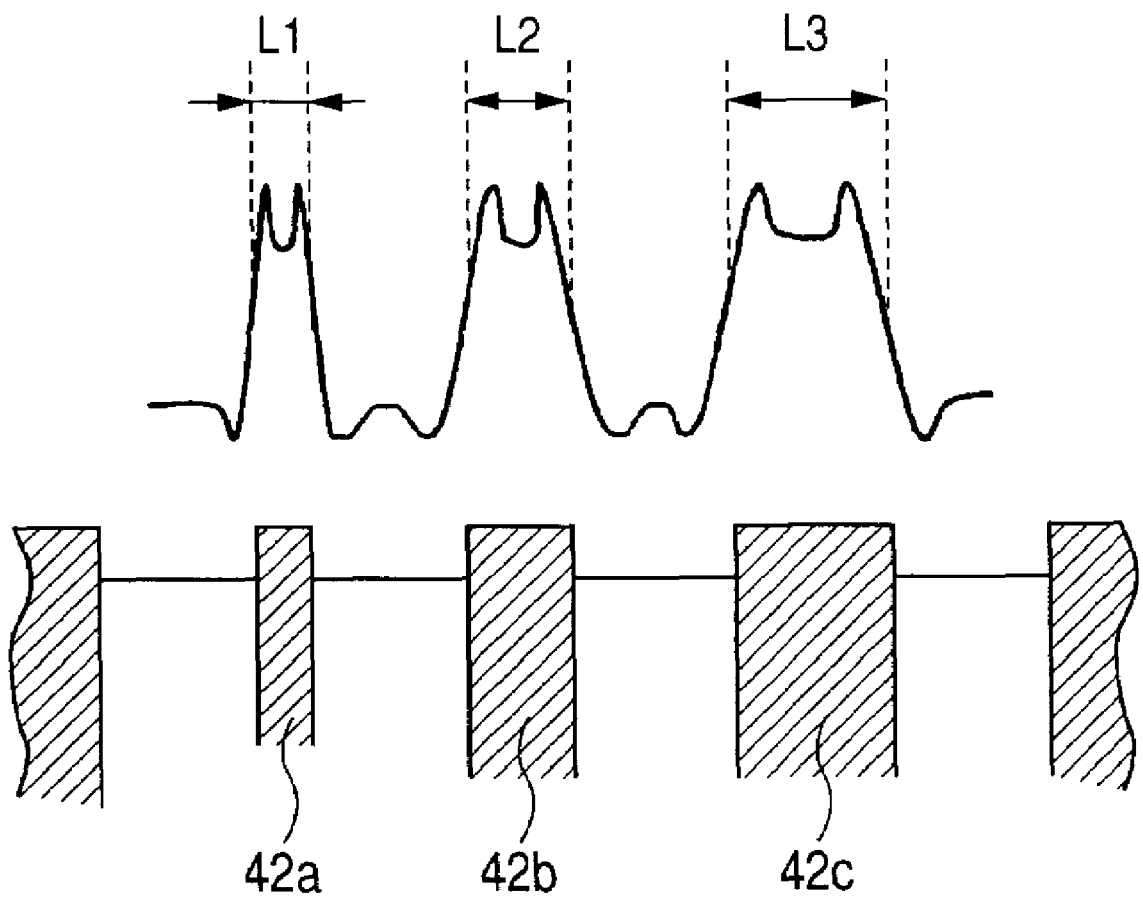
FIG. 4 is a schematic illustration showing a secondary electron image of the standard sample for the correction, according to the first embodiment of the invention.

As a result, a secondary electron is released from the standard sample 40 for the correction, and the secondary electron is captured by the detector 15. Data on the secondary electron from the detector 15 is sent out to the image acquisition subunit 51 of the image processing unit 50, whereupon a secondary electron image is acquired (step S5). In the secondary electron image, widthwise edges of each of the correction mark members 42 appear as peaks called white bands, respectively, as shown in FIG. 4. The size measurement subunit 52 of the image processing unit 50 measures an interval between the white bands, thereby obtaining a measurement width of each of the correction mark members 42 (step S6).

Further, unless a width of the correction mark member 42 is twice as large as a diameter of the electron beam falling thereon, the white bands will be lost, and therefore, with the present embodiment, the width Ln of the correction mark member 42 is set to 10 nm at the minimum against the diameter of the electron beam falling thereon, at 3 nm.

The size data obtained by the size measurement subunit 52 is sent out to the subtracter 54 via a switching subunit 53, whereupon there is found a difference between the measurement width, and the authorized width Ln stored in the authorized width storage region 58 (step S7). The electron beam is controlled by the integrating control unit 60 so as to sequentially irradiate the standard sample 40 for the correction, starting from the surface of a first correction mark member 42a thereof to the surface of a second correction mark member 42b, and so on, so that the size measurement subunit 52 sequentially outputs the measurement widths starting from a width L1 of the first correction mark member 42a to a width L2 of the second correction mark member 42b, and so on. The subtracter 54 sequentially extracts in that order starting from the authorized width Ln1 of the first correction mark member 42a to the authorized width Ln2 of the second correction mark member 42b, and so on, among a plurality of the authorized widths Ln1, Ln2, . . . , stored in the authorized width storage region 58, thereby subtracting the authorized widths Ln1, Ln2, . . . , from the measurement widths L1, L2, . . . , corresponding thereto.

Upon completion of a subtraction process (step S7) of the measurement widths L1, L2, . . . , minus the authorized widths Ln1, Ln2, . . . , respectively, the correction function generation subunit 55 finds a correction function f for correction of the measurement width La with reference to the sample M on the basis of the results of subtraction, and associate the correction function f with a magnification M at this point in time to be thereby stored in the correction function storage region 59 (step S8).

Figure 5:
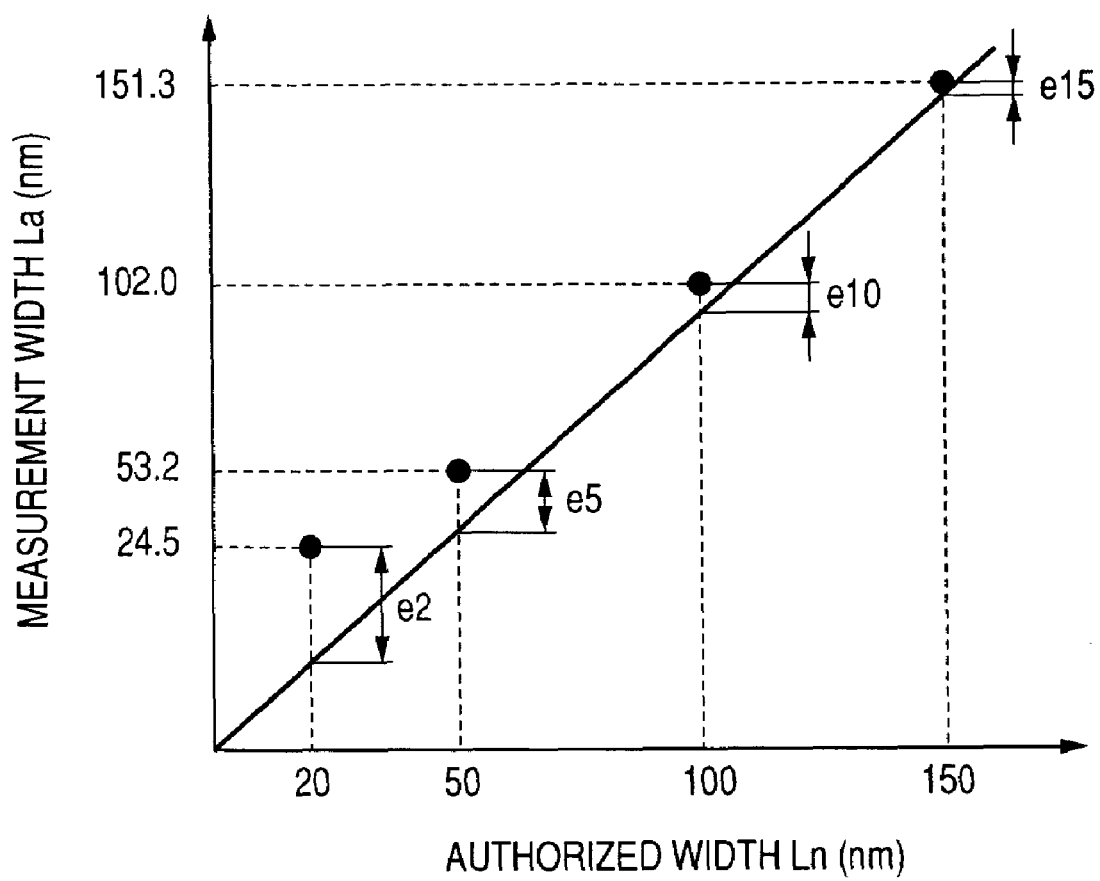
FIG. 5 is a graph showing a relationship between authorized widths of respective correction mark members, and measurement widths thereof.
Figure 6:
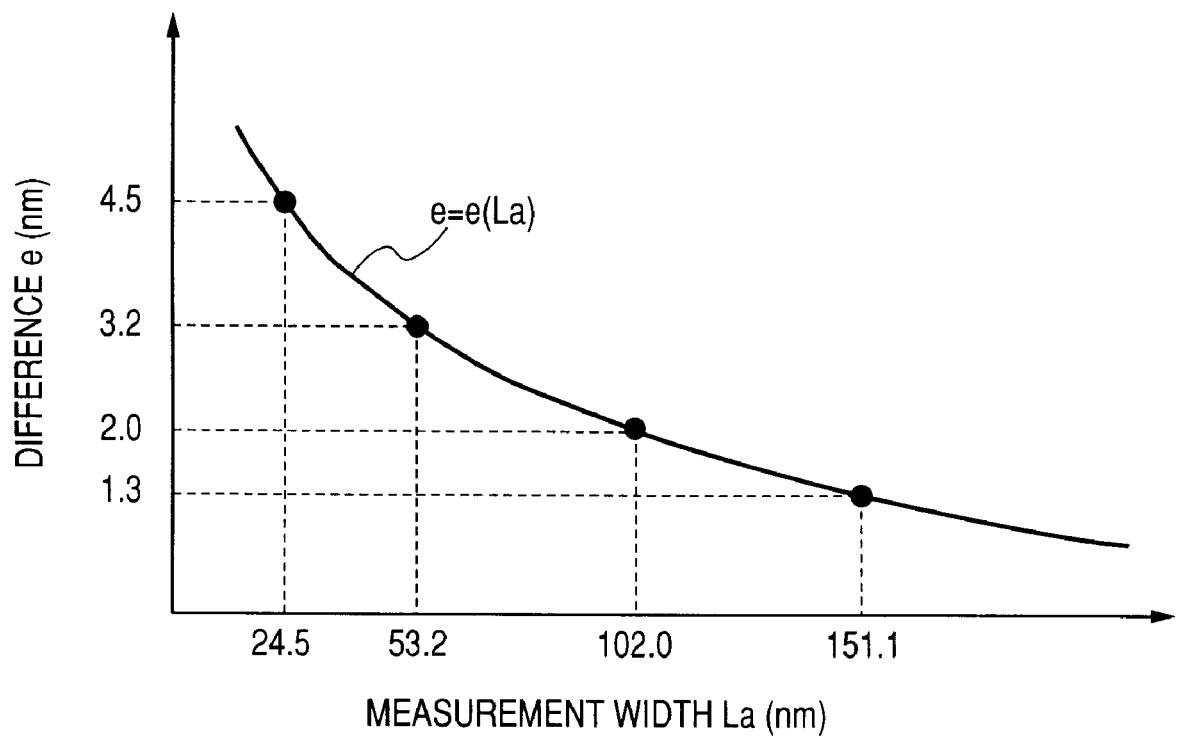
FIG. 6 is a graph showing a relationship between the measurement width, and a difference, according to the first embodiment of the invention.

Supposing that as a result of measuring the correction mark members 42 with the authorized widths Ln at 20 nm, 50 nm, 100 nm, and 150 nm, respectively, the measurement widths La at 24.5 nm, 53.2 nm, 102.0 nm, and 151.3 nm, respectively, are obtained, as shown in FIG. 5, in that case, a difference e obtained by subtracting the respective authorized widths Ln (20 nm, 50 nm, 100 nm, and 150 nm) from the respective measurement widths La (24.5 nm, 53.2 nm, 102.0 nm, and 151.3 nm) is 4.5 nm, 3.2 nm, 2.0 nm, and 1.3 nm, respectively. As shown in FIG. 6, a relationship between the measurement width La and the difference e is not linear, that is, the relationship is nonlinear, so that fitting is made with a quadratic function in this case, obtaining a function e=e (La). Further, it is deemed that the nonlinear relationship between the measurement width La and the difference e in the case of the present embodiment has been found out as a result of width correction executed by use of a multilayer film with respective widths extremely small in shape.

Incidentally, a relationship between the authorized width Ln, and the difference e satisfies the following equation:

$$La = Ln + e$$

Accordingly, if the authorized width Ln is solved by substituting the function e=e (La) for e in the equation, the following equation with the measurement width La as a variable is obtained:

$$Ln = La - e(La)$$

With the present embodiment, the above equation as the correction function f is stored in the correction function storage region 59, as shown hereunder.

$$Lp = La - e(La) = f(La)$$

Upon the correction function f being stored in the correction function storage region 59 (step S8), the integrating control unit 60 causes the input/output unit 65 to display "another magnification setting or not?." If the input/output unit 65 accepts an instruction for executing the process before the correction with another magnification setting (step S9), the operation reverts to the step S3, whereupon the integrating control unit 60 sets a new magnification to thereby find a correction function with the new magnification. Meanwhile, if the input/output unit 65 accepts an instruction for not executing the process before the correction with another magnification setting (the step S9), the operation proceeds to step S10, whereupon the integrating control unit 60 causes the input/output unit 65 to display "the measurement of the target sample or not?." If the input/output unit 65 accepts an instruction for not executing the measurement of the target sample (the step S10), a series of process steps are completed. Further, if the input/output unit 65 accepts an instruction for executing the measurement of the target sample (the step S10), the measurement of the target sample is started, whereupon the integrating control unit 60 issues an instruction to the carrier unit (not shown) to thereby set the sample M to the predetermined position on the stage 30 (step S20a), and subsequently, causes the stage 30 to move such that the sample M is irradiated with the electron beam (step S20b). Further, upon starting the measurement of the target sample, the integrating control unit 60 issues an instruction to the switching subunit 53 of the image processing unit 50 such that the measurement data obtained by the size measurement subunit 52 of the image processing unit 50 can be sent out to the correction subunit 56.

Subsequently, the integrating control unit 60 executes setting of a magnification (step S22), and electron beam control (step S23) in the same way as executed in the steps S3, S4, respectively. Then, the image processing unit 50 executes acquisition of a secondary electron image (step S24), and measurement of a width of a specified area (step S25) in the same way as executed in the steps S5, S6, respectively, provided that the secondary electron images of the sample M, within a specified region, are acquired in the step S24, and measurement of a width of a specified area, within the specified region, is executed in the step S25.

The measurement width data La of the sample M, obtained by the size measurement subunit 52, is sent out to the correction subunit 56 via the switching subunit 53. The correction subunit 56 acquires data on the magnification as set by the integrating control unit 60 in the step S22, extracting the correction function f (La) corresponding to the magnification, from the correction function storage region 59 (step S26). In case that the correction function at the same magnification as the set magnification is not stored in the correction function storage region 59, the correction subunit 56 extracts a correction function at a magnification closest to the set magnification from the correction function storage region 59. The correction subunit 56 substitutes the measurement width data La sent out from the size measurement subunit 52 for the correction function f (La) as extracted, thereby correcting the measurement width data La (step S27). Then, post-correction width data Lp is outputted to the input/output unit 65 via the integrating control unit 60 (step S28).

If the input/output unit 65 accepts an instruction for executing measurement of a width of another site of the sample M after the post-correction width data Lp is displayed (step S29), the operation reverts to the step S22, and if the input/output unit 65 accepts an instruction for not executing the measurement of the width of another site of the sample M, a series of process steps are completed.

Now, upon the input/output unit 65 accepting an instruction for measurement of the sample M in the step S0, the integrating control unit 60 causes the carrier unit to set the sample M to a predetermined position on the stage 30, and to subsequently move the stage 30 so as to enable the sample M to be irradiated with the electron beam (the step S20). At this point in time, the integrating control unit 60 issues an instruction to the switching subunit 53 of the image processing unit 50 to thereby transmit the width data obtained by the size measurement subunit 52 of the image processing unit 50 to the subtracter 54.

Subsequently, the integrating control unit 60 issues an instruction to the electron gun power supply circuit 21 to thereby cause the electron gun 11 to emit the electron beam (step S21), whereupon the operation proceeds to the step S22.

In the case where the measurement of the target sample (the steps S20a, S20b, S22 to S29) subsequently to the process before the correction (the steps S1 to S10) is executed, if the operator inputs a magnification to be adopted at the measurement of the target sample to the input/output unit 65 upon setting the magnification at the time of the process before the correction (the step S3), as previously described, it is possible to obtain the correction function at the magnification adopted at the measurement of the target sample in the step S8. However, if the measurement of the target sample (the steps S20, S21, S22 to S29) is immediately executed, there is a possibility that the correction function at the magnification to be adopted at the measurement is not stored in the correction function storage region 59. In such a case, the correction subunit 56 extracts the correction function at the magnification closest to the set magnification from the correction function storage region 59, as previously described.

As described above, with the present embodiment, when the correction mark members 42 having respective widths differing from each other are measured, the respective correction functions are determined on the basis of errors of the respective measurement widths, thereby correcting the respective measurement widths of the sample M according to the respective correction functions, so that even if the errors are nonlinear in relation to variation in the measurement width, the measurement widths can be corrected with greater precision.

Further, with the present embodiment, the correction function $f(La)=La-e(La)$ is kept stored in the correction function storage region 59, and the correction subunit 56 substitutes the measurement width La of the sample M for the correction function, thereby correcting the measurement width La, however, with the function $e=e(La)$ kept stored in the correction function storage region 59, the correction subunit 56 may instead substitute the measurement width La of the sample M for the function $e=e(La)$, and may find the difference e of the measurement width La, against the authorized width, subsequently, subtracting the difference e from the measurement width La to thereby execute correction of the measurement width La.

Still further, with the present embodiment, by use of the correction function kept stored in the storage region, the correction of the measurement width La is executed, however, in place of the correction function, relationship of the respective measurement widths La with the respective post-correction widths Lp, or relationship of the respective measurement widths La with the respective differences e, in terms of values, may be kept on a table under control, and the correction of the measurement width La my be executed.

Yet further, with the present embodiment, the correction function based on the measurement width La as a variable is found on a magnification-by-magnification basis, and the correction functions corresponding to respective magnifications are stored in the storage region, however, a correction function based on not only the measurement width La but also the magnification, serving as a variable, may be found instead, and those correction functions may be stored in the storage region.

Further, with the present embodiment, use is made of the standard sample 40 for the correction, having the standard sample member 41 for the correction, comprising the correction mark members 42 that are lined up in the specified direction, however, it goes without saying that if use is made of a standard sample for correction, having two standard sample members 41, 41, each comprising the correction mark members 42, and respective directions of lineup thereof, forming an angle of 90°, it is possible to execute width correction not only in one direction on a plane parallel to the upper surface of the stage 30 but also in a direction perpendicular to the one direction.

Now, there is described hereinafter a second embodiment of the invention with reference to FIGS. 7 to 10.

Figure 8:
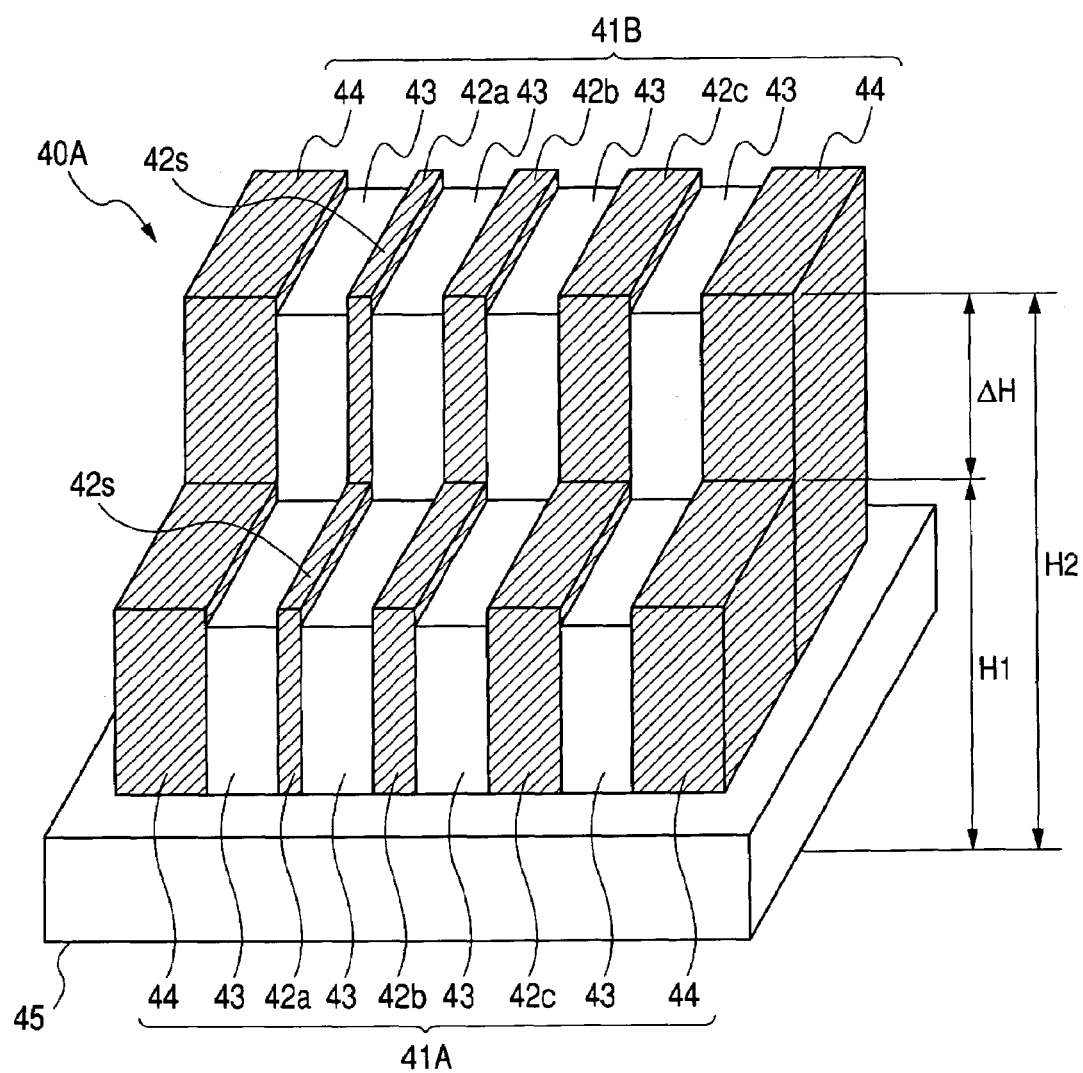
FIG. 8 is a schematic perspective view showing a standard sample for correction, according to a second embodiment of the invention.

As shown in FIG. 8, a standard sample 40A for correction, according to the present embodiment, is provided with a first standard sample member 41A for correction, a second standard sample member 41B for correction, and a base 45 to which the first and second standard sample members 41A, 41B are fixedly attached.

The first standard sample member 41A for the correction, and the second standard sample member 41B for the correction is each basically the same in makeup as the standard sample member 41 for the correction, according to the first embodiment, except that a height H1 from the base 45 to an irradiated face 42s of the first standard sample member 41A for the correction differs from a height H2 from the base 45 to an irradiated face 42s of the second standard sample member 41B for the correction. With the present embodiment, a height difference ΔH between the first and second standard sample member 41A, 41B for the correction is 100 μm.

Thus, with the present embodiment, use is made of the standard sample 40A for the correction, differing from the standard sample 40 for correction, according to the first embodiment, so that, in a scanning electron microscope as well, an image processing unit for executing correction of a measurement width differs in makeup from the image processing unit according to the first embodiment. Further, hardware makeup of the image processing unit, and makeup of other units are the same as those for the first embodiment.

Figure 7:
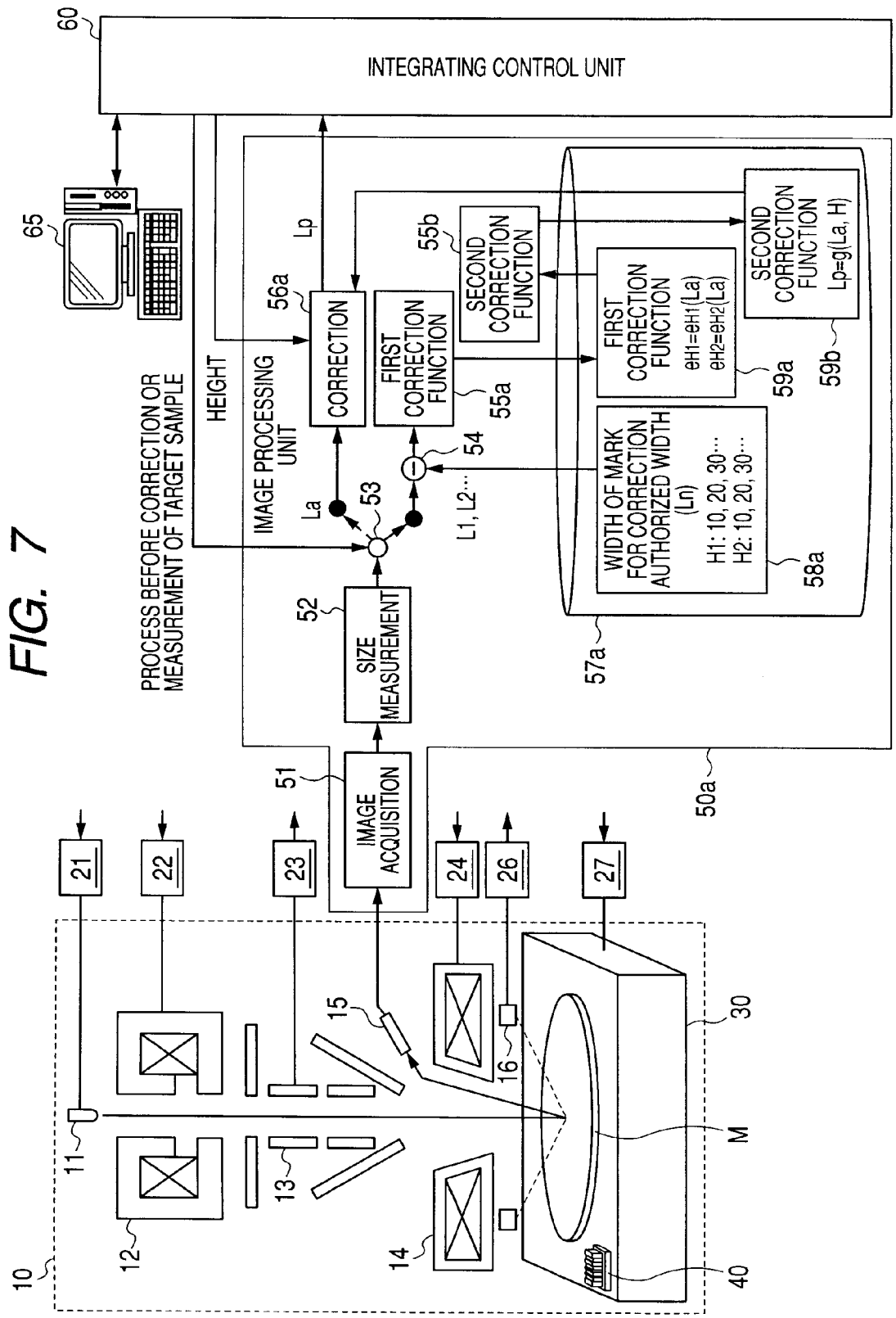
FIG. 7 is a schematic block diagram showing makeup of a second embodiment of a scanning electron microscope according to the invention.

As shown in FIG. 7, the image processing unit 50a according to the present embodiment comprises an image acquisition subunit 51 for acquiring a secondary electron image on the basis of data on a secondary electron from a detector 15, a size measurement subunit 52 for measuring a width of a specified area on the basis of the secondary electron image, a subtracter 54 for finding a difference between a measurement width L of the standard sample 40A for the correction, and an authorized width Ln thereof, a first correction function generation subunit 55a for finding a first correction function with a measurement width La as a variable, a second correction function generation subunit 55b for finding a second correction function with the measurement width La, and a height H of a sample M as variables, a correction subunit 56a for correcting the measurement width La with reference to the sample M by use of the second correction function, a memory 57a for storing various data, and a switching subunit 53 for selectively switching a transmission destination of measurement data obtained by the size measurement subunit 52 to either the subtracter 54, or the correction subunit 56a.

The memory 57 has an authorized width storage region 58a for storing the authorized widths Ln of the standard sample 40A for the correction, a first correction function storage region 59a for storing the first correction function generated by the first correction function generation subunit 55a, and a second correction function storage region 59b for storing the second correction function generated by the second correction function generation subunit 55b. Authorized widths of respective widths of the correction mark members 42 of the first standard sample member 41A for correction within the standard sample 40A for the correction, and respective heights of the correction mark members 42 as well as authorized widths of respective widths of the correction mark members 42 of the second standard sample member 41B for correction within the standard sample 40A for the correction, and respective heights of the correction mark members 42 are stored in the authorized width storage region 58a.

Figure 9:
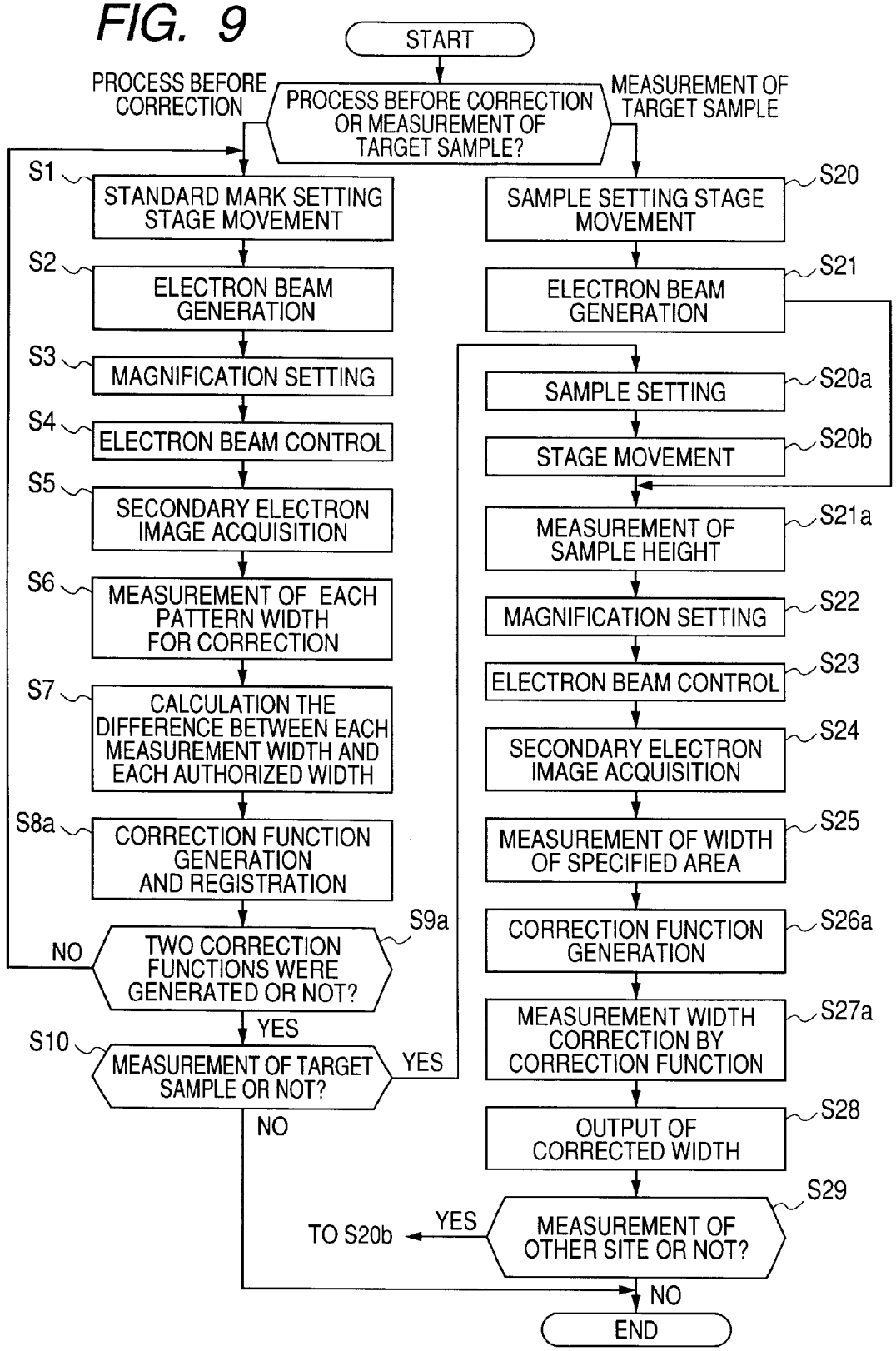
FIG. 9 is a flow chart showing operation of the scanning electron microscope according to the second embodiment of the invention.

Now, operation of the scanning electron microscope according to the present embodiment is described hereinafter with reference to a flow chart shown in FIG. 9.

With the present embodiment as well, an instruction for whether the process before the correction is executed, or the measurement of the sample M is executed is accepted (step S0) as is the case with the first embodiment. In the case of receiving the instruction for executing the process before correction, there are executed setting of the standard sample 40 for the correction, and movement of a stage 30 (step S1), generation of an electron beam (step S2), setting of a magnification (step S3), control of the electron beams (step S4), acquisition of a secondary electron image (step S5), measurement of a width of each of the correction mark members 42 (step S6), and calculation of a difference between a measurement width of each of the correction mark members 42, and each of the authorized widths (step S7). However, because the electron beams are irradiated onto the first standard sample member 41A for the correction in the step S4 of the present embodiment, the calculation of the difference between the measurement width of each of the correction mark members 42 of the first standard sample member 41A for the correction, and the authorized width corresponding thereto is executed in the step S7.

Subsequently, the first correction function generation subunit 55a finds the first correction function to be thereby stored in the first correction function storage region 59a (step S8a). The first correction function can be found by the same method as a method for finding the correction function according to the first embodiment. In this case, the function e=e (La) for finding e with the measurement width as a variable La can be found as the first correction function.

Subsequently, determination is made on whether or not two correction functions have been generated (step S9a), and if the two correction functions have not been generated, an instruction for causing the electron beams to scan the second standard sample member 41B for the correction is given to an integrating control unit 60. Upon receiving this instruction, the operation reverts to the step S4, and after the respective steps S5, S6, S7, the second correction function based on the measurement width of each of the correction mark members 42 of the second standard sample member 41B for the correction is found by the second correction function generation subunit 55b in the step S8a, and the second correction functions are stored in the second correction function storage region 59b. Thereafter, determination is again made on whether or not two correction functions have been generated (the step S9a), and if the two correction functions have been generated, the operation proceeds to the measurement of the sample M.

Figure 10:
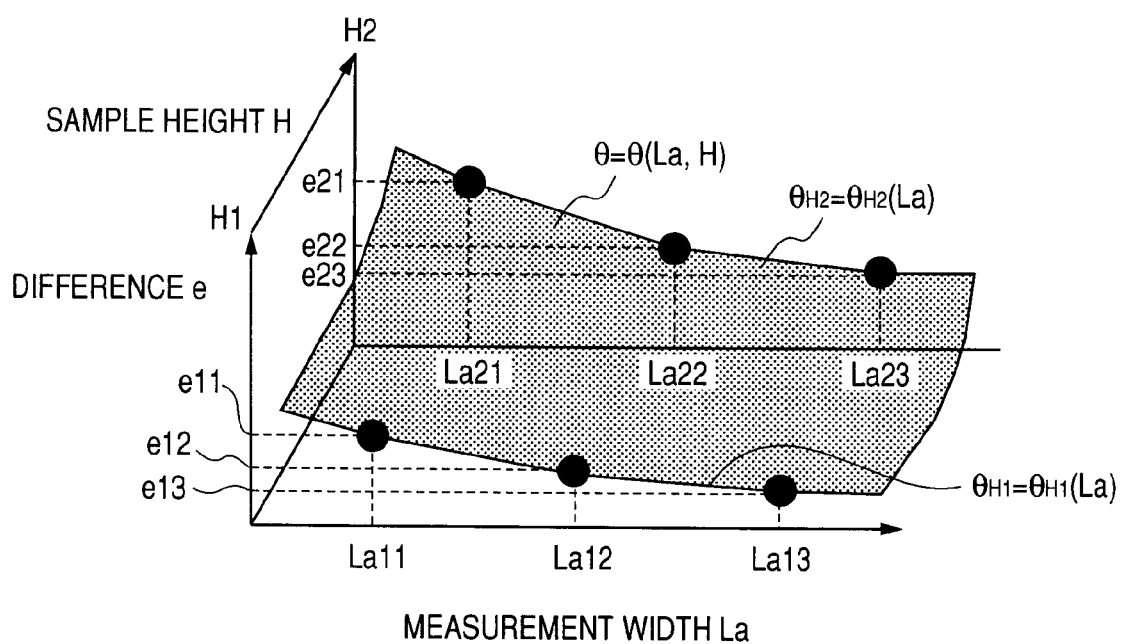
FIG. 10 is a graph showing a relationship among a measurement width, a sample height, and an error, according to the second embodiment of the invention.

Herein, a method for finding the second correction function is described hereinafter with reference to FIG. 10.

As a result of processing executed twice in the step S8a, while the first correction function $e_{H1}=e_{H1}$ (La) based on the measurement width of each of the correction mark members 42 of the first standard sample member 41A for the correction, having the height H1, is found, there is found the second correction function $e_{H2}=e_{H2}$ (La) based on the measurement width of each of the correction mark members 42 of the second standard sample member 41B for the correction. If the measurement width is identical, fitting is made with a linear function as for a relationship of the height H and the difference e, so that in the case of the present embodiment, there is generated a function e=e (La, H) for finding e, with the measurement width La, and the height H, as the variables. Then, the following equation is designated as the second correction function g.

$$Lp = La - e(La, H) = g(La, H)$$

If the second correction function g is found (the step S8b), determination is made on whether or not an instruction for the measurement of the target sample is accepted (step S10), as is the case with the first embodiment, and if the instruction for the measurement of the target sample is not accepted, process steps are completed while if the instruction for the measurement of the target sample is accepted, there are executed setting of the sample M (step S20a), and movement of the stage 30 (step S20b).

Subsequently, the integrating control unit 60 causes height sensors 16 to detect a height of the sample M (step S21a). Thereafter, as is the case with the first embodiment, there are executed setting of a magnification (step S22), an electron beam control (step S23), acquisition of a secondary electron (step S24), and measurement of a width of a specified area (step S25). The measurement width data obtained by the size measurement subunit 52 is sent out to the correction subunit 56a via the switching subunit 53.

The correction subunit 56a acquires the measurement width La from the size measurement subunit 52, and acquires also the height of the sample M, obtained in the step S21a, from the integrating control unit 60. Subsequently, the correction subunit 56a extracts the second correction function g (La, H) from the second correction function storage region 59b, and by substituting the measurement width La and the height of the sample M for the second correction function g (La, H), the measurement width data La is corrected (step S27a). Subsequently, post-correction width data Lp is outputted to the input/output unit 65 via the integrating control unit 60 (step S28).

If the input/output unit 65 accepts an instruction for executing measurement of a width of another site of the sample M after the post-correction width data Lp is displayed (step S29), as in the case of the first embodiment, the operation reverts to the step S22, and if the input/output unit 65 accepts an instruction for not executing the measurement of the width of another site of the sample M, a series of process steps are completed.

As described in the foregoing, with the present embodiment as well, when the correction mark members 42 having respective widths differing from each other are measured, the respective correction functions are determined on the basis of errors of the respective measurement widths, thereby correcting the respective measurement widths of the sample M according to the respective correction functions, so that even if the errors are nonlinear in relation to variation in the measurement width, the measurement widths can be corrected with greater precision.

Further, with the present embodiment, the second correction function g (La, H)=La−e (La, H) is kept stored in the second correction function storage region 59b, and the correction subunit 56 substitutes the measurement width La, and the height of the sample M for the second correction function g (La, H), thereby correcting the measurement width La, however, with the function e (La, H) kept stored in the second correction function storage region 59b, the correction subunit 56 may instead substitute the measurement width La, and the height of the sample M for the function e (La, H), and may find the difference e of the measurement width La, against the authorized width, thereafter subtracting the difference e from the measurement width La to thereby execute correction of the measurement width La.

Further, with the second embodiment described as above, corrections according to various magnifications are not executed, however, it is preferable to execute corrections according to various magnifications as well as in the case of the first embodiment.

Still further, with any of the embodiments described in the foregoing, the correction function is found by use of the standard sample 40 for the correction, or the standard sample 40A for the correction, however, the correction functions as found may be stored in the memory beforehand, and measurement widths may be corrected by use of the correction functions, respectively.

Yet further, with the respective embodiments described in the foregoing, the standard sample 40 for the correction, and the standard sample 40A for the correction are used for correction of the measurement width La only, however, those standard samples for the correction can also be used for finding a diameter of an incident beam, and a tilt angle of an incident beam besides for correction of the measurement width. In the case of finding the diameter of the incident beam, respective widths of a plurality of the correction mark members are set to not more than twice as large as the diameter of the incident beam, preferably to not more than one time the diameter of the incident beam. In this case, the white bands as previously described do not appear in the secondary electron image, and an image in the shape of a gently-sloping angle, in other words, in a Gaussian function-like shape is obtained, and a beam diameter can be found from a characteristic amount of the shape of the gently-sloping angle. Further, in the case of finding the tilt angle of the incident beam, the same standard sample for the correction as used in the respective embodiments described in the foregoing. In this case, the tilt angle of the incident beam is found from a difference in width between the respective white bands on the left and right sides of the secondary electron image.

What is claimed is:

1. A charged particle beam measurement equipment for obtaining a size data item on an area of a sample on the basis of data obtained from a secondary particle from the sample by irradiating the sample with a charged particle beam to be scanned, said charged particle beam measurement equipment comprising:

first storage unit for storing width data items of respective correction mark members of a standard sample for correction, the standard sample for correction being provided with a plurality of the correction mark members having respective widths differing from each other;

error computation unit for finding a difference between a measurement width data item on each of the correction mark members of the standard sample for the correction, obtained by irradiating and scanning the sample with the charged particle beam, and a width data item corresponding thereto among a plurality of the width data items stored in the first storage unit on a measurement width data item-by-measurement width data item basis;

relationship generation unit for finding a relationship between the respective measurement width data items on the correction mark members of the standard sample for the correction, obtained by irradiating and scanning the sample with the charged particle beam, and respective errors corresponding thereto, found by the error computation unit, or a relationship between the respective measurement width data items, and respective post-correction width data items after correction with the respective errors found by the error computation unit;

second storage unit for storing the relationship found by the relationship generation unit; and correction unit for correcting the measurement width data items obtained by irradiating and scanning the sample with the charged particle beam by use of the relationship found by the relationship generation unit.

2. The charged particle beam measurement equipment according to claim 1, further comprising a standard sample for correction.

3. A charged particle beam measurement equipment for obtaining a size data item on an area of a sample on the basis of data obtained from a secondary particle from the sample by irradiating the sample with a charged particle beam to be scanned, said charged particle beam measurement equipment comprising:
 a memory unit for containing nonlinear relationship between variation in measurement width data items obtained by measurement, and variation in correction value for the measurement width data items, or nonlinear relationship between the variation in the measurement width data items, and variation in post-correction width data items
 a correction unit for correcting the measurement width data items obtained by irradiating the sample with the charged particle beam with the use of the nonlinear relationship stored in the memory unit; and
 a height detection unit for detecting a height of the sample, wherein the standard sample for correction comprises first and second standard sample members for correction, each having the plurality of the correction mark members with respective widths differing from each other, the plurality of the correction mark members of the first standard sample member for correction differ in height from the plurality of the correction mark members of the second standard sample member for correction, the respective width data items of the plurality of the correction mark members of the first standard sample member for correction, and a height of the correction mark members thereof as well as the respective width data items of the plurality of the correction mark members of the second standard sample member for correction, and a height of the correction mark members thereof are stored in the first storage unit, the error computation unit finds a difference between a measurement width data item on each of the correction mark members of the first standard sample member for correction, obtained by irradiating and scanning the sample with the charged particle beam, and a width data item corresponding thereto among the plurality of the width data items stored in the first storage unit on a measurement width data item-by-measurement width data item basis while finding a difference between a measurement width data item on each of the correction mark members of the second standard sample member for correction, obtained by irradiating and scanning the sample with the charged particle beam, and a width data item corresponding thereto among the plurality of the width data items stored in the first storage unit on a measurement width data item-by-measurement width data item basis, the relationship generation unit comprises first relationship generation unit for finding a first relationship a between the respective measurement width data items on the correction mark members of the first standard sample member for correction, obtained by irradiating and scanning the first standard sample member for correction with the charged particle beam, and respective errors corresponding thereto, found by the error computation unit, and a first relationship b between the respective measurement width data items on the correction mark members of the second standard sample member for correction, obtained by irradiating and scanning the second standard sample member for correction with the charged particle beam, and respective errors corresponding thereto, found by the error computation unit, and second relationship generation unit for finding a second relationship among the measurement width data item, the error corresponding thereto, found by the error computation unit, and the height of the sample, by use of the first relationship a, and the height of the first standard sample member for correction, used when finding the first relationship a as well as the first relationship b and the height of the second standard sample member, used when finding the first relationship b, or finding a second relationship among the measurement width data item, the height of the sample, and a post-correction width data item after correction with the error corresponding thereto, found by the error computation unit, the second storage unit stores the second relationship found by the second relationship generation unit, and the correction unit corrects the measurement width data items obtained by irradiating and scanning the sample with the charged particle beam by use of the height of the sample found by the height detection unit, and the second relationship stored in the second storage unit.

4. The charged particle beam measurement equipment according to claim 3, further comprising a standard sample for correction.

5. A size correction method using a charged particle beam measurement equipment for obtaining a size data item on an area of a sample on the basis of data obtained from a secondary particle from the sample by irradiating the sample with a charged particle beam to be scanned, said size correction method pre-storing width data items of respective correction mark members of a standard sample for correction in the charged particle beam measurement equipment, the standard sample for correction being provided with a plurality of the correction mark members having respective widths differing from each other, and causing the charged particle beam measurement equipment to execute:
 an error computation step of finding a difference between a measurement width data item on each of the correction mark members of the standard sample for the correction, obtained by irradiating and scanning the sample with the charged particle beam, and a width data item corresponding thereto among a plurality of width data items stored on a measurement width data item-by-measurement width data item basis;
 a relationship generation step of finding a relationship between the respective measurement width data items on the correction mark members of the standard sample for the correction, obtained by irradiating and scanning the sample with the charged particle beam, and respective errors corresponding thereto, found by the error computation unit, or a relationship between the respective measurement width data items, and respective post-correction width data items after correction with the respective errors found by the error computation unit; and
 a correction step of correcting the measurement width data items obtained by irradiating and scanning the sample with the charged particle beam by use of the relationship found by the relationship generation step.

* * * * *